United States Patent [19]
Patterson

[11] Patent Number: 4,551,910
[45] Date of Patent: Nov. 12, 1985

[54] MOS ISOLATION PROCESSING
[75] Inventor: Elizabeth L. Patterson, Hillsboro, Oreg.
[73] Assignee: Intel Corporation, Santa Clara, Calif.
[21] Appl. No.: 675,128
[22] Filed: Nov. 27, 1984
[51] Int. Cl.[4] ...................... H01L 21/76; H01L 21/94
[52] U.S. Cl. .................................. 29/576 W; 29/571; 148/DIG. 117; 148/1.5; 357/48; 357/49; 427/94
[58] Field of Search .................... 29/571, 576 W, 578; 357/48, 49, 15; 427/94, 95, 93; 148/DIG. 81, 148/1.5, DIG. 117

[56] References Cited
U.S. PATENT DOCUMENTS

| | | | |
|---|---|---|---|
| 3,751,722 | 8/1973 | Richman | 357/23 |
| 3,752,711 | 8/1973 | Kooi et al. | 29/571 X |
| 3,906,541 | 9/1975 | Goronkin | 357/15 X |
| 4,352,236 | 10/1982 | McCollum | 29/571 |

OTHER PUBLICATIONS

Hui et al, "Selective Oxidation Technologies for High Density MOS", IEEE Elec. Dev. Lett., vol. EDL-2, No. 10, Oct. 1981, pp. 244–247.
Hui et al, "Electrical Properties of MOS Devices Made with SILO Technology", IEDM, 1982, p. 220.

Primary Examiner—Brian E. Hearn
Assistant Examiner—David A. Hey
Attorney, Agent, or Firm—Blakely, Sokoloff, Taylor & Zafman

[57] ABSTRACT

A process for growing field oxide regions in an MOS circuit. An initial thermally grown layer of silicon nitride seals the substrate surface and reduces lateral oxidation, or bird's beak formation along the substrate-nitride interface. Field oxidation takes place in two steps, with the first step being a dry oxidation in HCL and the second taking place in steam.

9 Claims, 7 Drawing Figures

4,551,910

MOS ISOLATION PROCESSING

BACKGROUND OF THE INVENTION

1. Field of the Invention

This invention relates to the field of oxides for integrated circuits, particularly metal-oxide-semiconductor (MOS) circuits.

2. Prior Art

In the fabrication of metal-oxide-semiconductor (MOS) circuits, "front end" processing is used to form thick field oxide regions at predetermined sites on the substrate. These thick field oxide regions are used primarily for isolation, for example, to prevent parasitic conduction which would otherwise occur when conductive lines cross these regions.

The most common process for forming these field oxide regions employs a silicon nitride layer. Openings are formed in this layer at the predetermined sites and then an oxide is grown on the substrate. The oxide grows primarily at the openings and not at the regions protected by the silicon nitride layer. As the oxide grows, its lifts the edges of the silicon nitride layer at the openings. In these areas of lifted silicon nitride, the field oxide becomes thinner, and is generally tapered. These tapered regions, which occur at the nitride-substrate interface, are sometimes referred to as "bird beaks" since their cross section resembles a bird's beak.

The bird beak oxide regions, as will be described in more detail in conjunction with FIG. 1, consume substrate area without providing benefits. For example, in the beak region of the oxide is generally too thin to provide good field isolation and yet too thick to be used as part of active devices.

Several solutions have been proposed to reduce bird's beak or otherwise save substrate area. U.S. Pat. No. 4,352,236 teaches the formation of two oxide fields, one thicker than the other. The thinner oxide has a smaller beak and is used where less isolation is required.

The control of bird's beaks was addressed by J. Hui, et al, in "Selective Oxidation Technologies for High Density MOS", IEEE Electronic Devices Letters, Vol. EDL-2, No. 10, October, 1981 p. 244, and in "Electrical Properties of MOS Devices Made with SILO Technology", IEDM, 1982, p. 220. Hui teaches the forming of a nitride layer directly on the substrate, with no intervening oxide layer.

The forming of local oxide regions using silicon nitride is discussed in U.S. Pat. Nos. 3,751,722 and 3,752,711. Neither of the patents addresses the problems of bird's beaks.

SUMMARY OF THE INVENTION

An improved process for forming oxide field-isolation regions in an MOS process is described. A thin layer of silicon nitride (Si3N4) is thermally grown on the surface of a silicon substrate. The nitride layer is then thickened through a low pressure, chemical vapor deposition (LPCVD) step. The total thickness of the thermally formed and CVD nitride is approximately 275–280A thick. Through standard masking and etching steps, openings are formed in the nitride layer, exposing the silicon substrate. After ion implantation, the substrate is subjected to dry oxidation in a chlorine ambient (HCL) at a temperature above the flow point of silicon dioxide. Subsequently a wet oxidation step is utilized to grow the oxide to its desired thickness. The formation of oxide at the nitride-silicon interface is substantially reduced, permitting electrical isolation without forfeiting active device area.

DETAILED DESCRIPTION OF THE PRESENT INVENTION

A field oxidation process is described for MOS circuits which results in effective isolation of semiconductor elements with decreased bird's beaks. In the following description, numerous specific details are set forth such as layer thickness, etc., in order to provide a thorough understanding of the invented process. It will be obvious to one skilled in the art, however, that the invention may be practiced without these specific details. In other instances, well-known processing steps have not been described in detail in order not to obscure the present invention in unnecessary detail.

PRIOR ART

Figure 1:
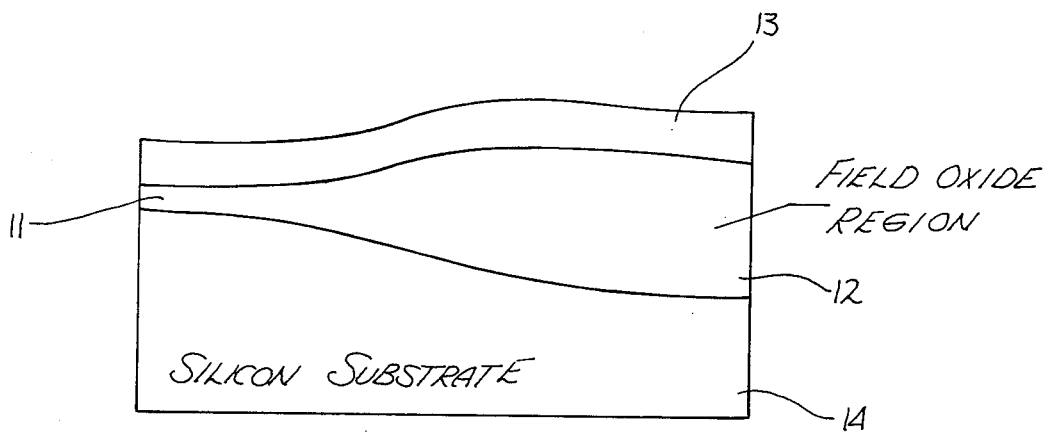
FIG. 1 is a cross-sectional elevation view of a bird's beak in a MOS circuit formed by prior art processing.

In general, field oxides in the prior art have most often been formed by oxidation of the silicon substrate in a wet atmosphere or a pressurized atmosphere in the presence of oxygen; for instance, steam in the temperature range between 900 degrees C. and 950 degrees C. The silicon nitride members in some cases are placed directly on the native oxide and in other cases, are formed on silicon dioxide layers. The latter results in unacceptable lateral oxidation increasing the size of the bird's beaks at the substrate-nitride interface. A typical example of prior art bird's beaks is shown in FIG. 1. A field oxide region 12 is formed on the substrate 14 with overlying layer 13 shown over the field oxide region. The bird's beak 11 is typical of prior art processing, and as can be seen, this relatively thin oxide provides little isolation and yet consumes considerable substrate area.

PREFERRED EMBODIMENT OF THE PRESENT INVENTION

Figure 2:
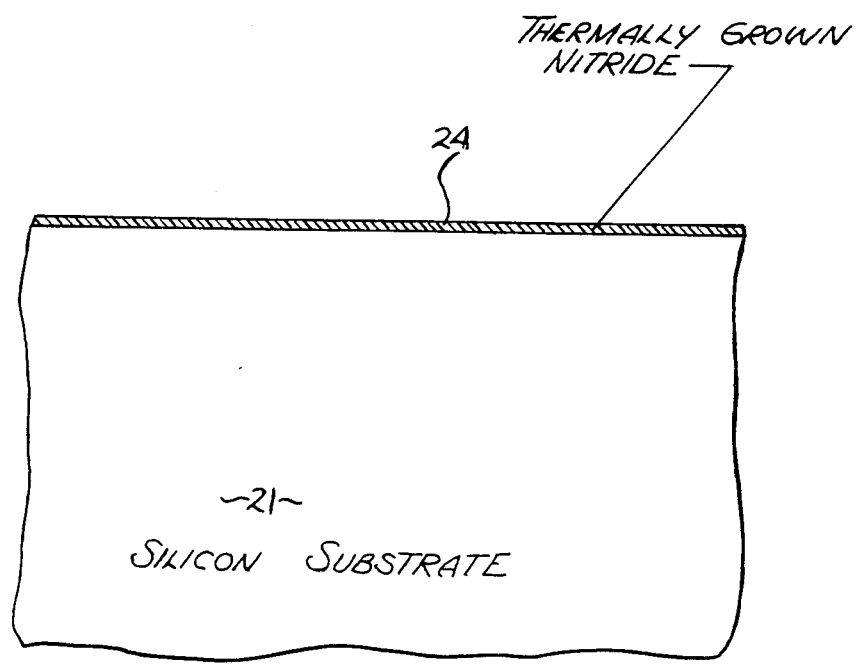
FIG. 2 is a cross-sectional elevation view of a substrate covered with a layer of thermally formed silicon nitride.

In the initial step of the invented process, shown in FIG. 2, a very thin silicon nitride layer 24 is thermally grown on the surface of the substrate 21 directly over the native oxide. This nitride layer 24 seals the substrate surface and thus prevents lateral oxidation along the substrate-nitride interface. In the presently preferred practice, the nitride is grown with ammonia in a diffusion tube at 1000 degrees C. to a thickness of 25A to 30A.

Figure 3:
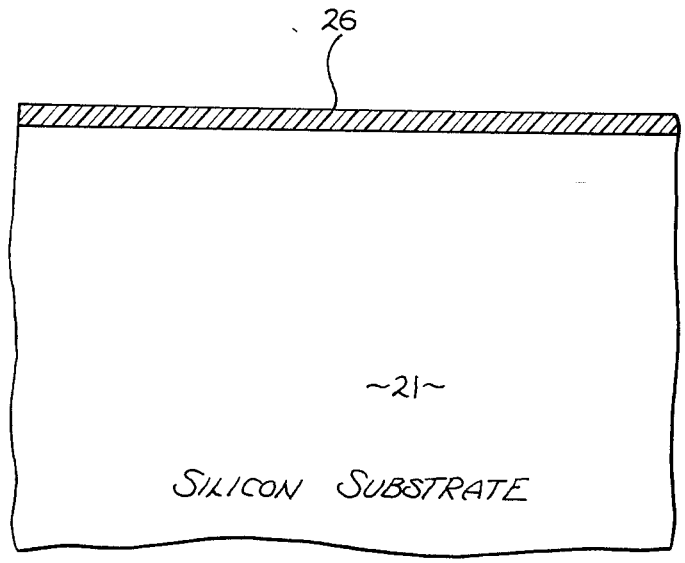
FIG. 3 illustrates the substrate of FIG. 2 after an additional layer of silicon nitride has been vapor deposited thereon.

This first nitride layer is thickened by the addition of an LPCVD layer of silicon nitride deposited directly over the thermally grown layer. In the current practice of the invention, the LPCVD layer is 250A thick. The thermally grown and the LPCVD layer are shown together in FIG. 3 as layer 26. In the preferred embodiment, layer 26 is 275-280A thick.

Figure 4:
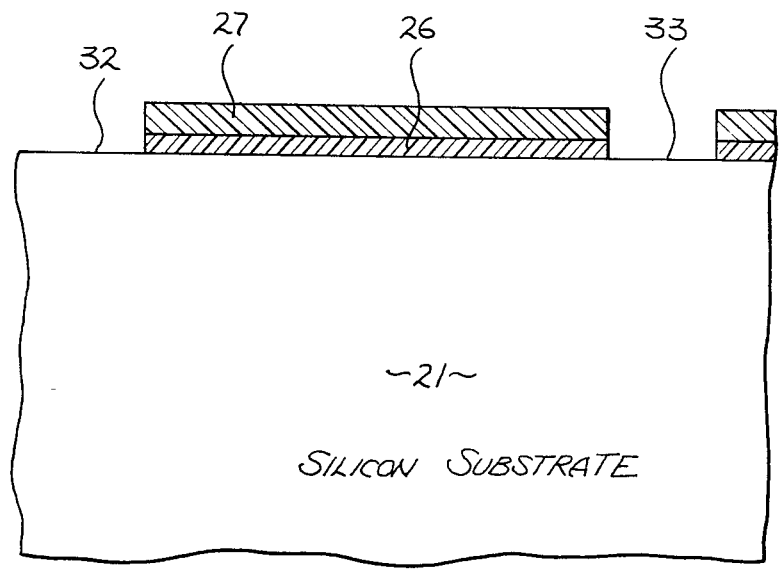
FIG. 4 illustrates the substrate of FIG. 3 after a photoresist layer has been formed over the substrate and openings formed through the photoresist layer and silicon nitride layer.

A layer of photoresist 27 of FIG. 4 is formed on the surface of the substrate (above the nitride layer 26) and through standard masking and etching steps, openings 32 and 33 are formed through the photoresist 27 and nitride layer 26 to the silicon substrate 21. The openings 32 and 33 are the locations in which the field oxide regions will be grown.

Figure 5:
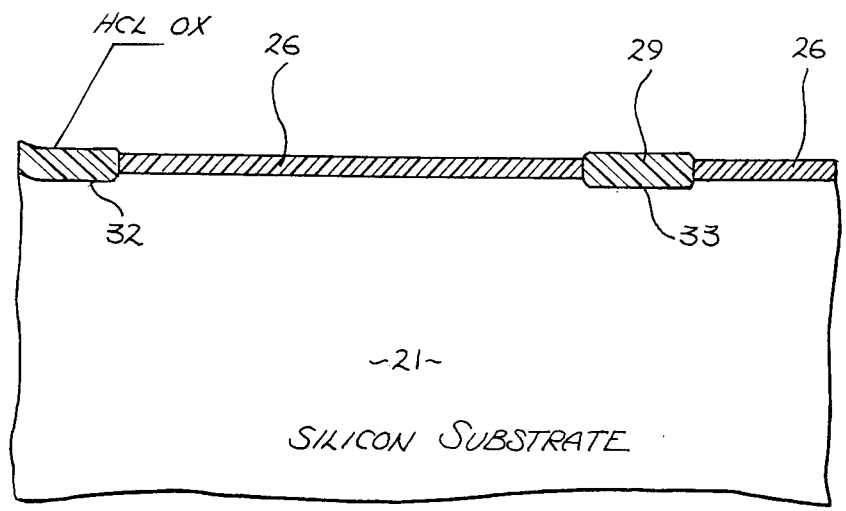
FIG. 5 illustrates the substrate of FIG. 4 after the field oxide is partially grown on the substrate in a dry (HCL) step.

Following removal of the photoresist, a dry oxidation step is used to grow oxide 29 at the field oxide regions 32 and 33 (see FIG. 5). This dry oxidation step takes place in the presence of chlorine (e.g., an HCL atmosphere) at 1000 degrees C. The temperature in this step is important to the process. The temperature must be greater than the temperature which defines the flow point of silicon dioxide (950-975 degrees C.) in order to prevent defect formation during the subsequent steam oxidation step. The dry oxidation layer 29 is grown through a thickness of approximately 500A. One skilled in the art will recognize that other thicknesses may be employed to achieve the advantage of the present invention.

Figure 6:
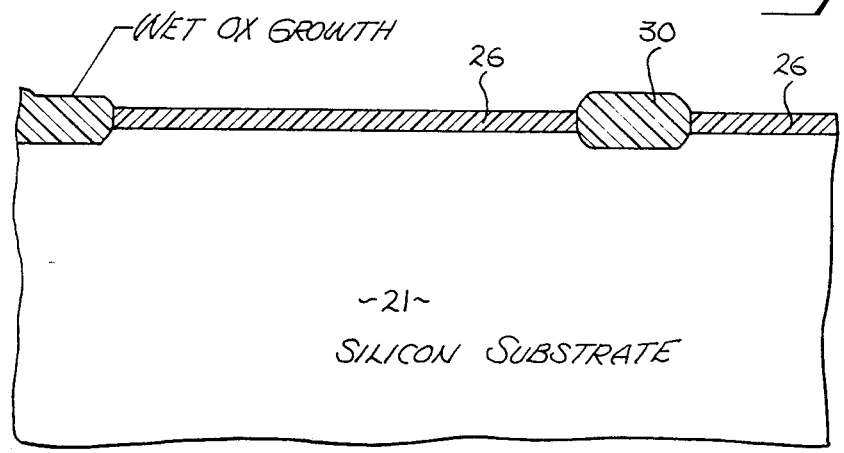
FIG. 6 illustrates the substrate of FIG. 5 after the field oxide has been fully grown on the substrate in a wet step.

Finally, a wet oxidation step is performed at 920 degrees C. to grow an additional 6000A of oxide. The resulting oxide regions 30 of FIG. 6 are thus 6500A thick in the preferred embodiment of the present invention.

Figure 7:
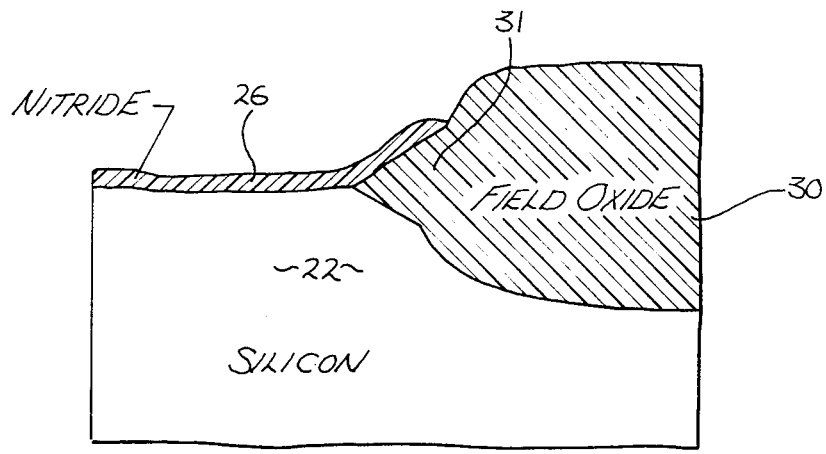
FIG. 7 illustrates the nitride-silicon interface with the present invention.

Referring to FIG. 7, the profile of the bird's beak 31 which results when substrates are processed utilizing the present invention is shown. When the present invention is practiced in the preferred embodiment, the extension of the beak 31 has been shown to be reduced to 0.25 microns. The shorter length of the profile of the bird's beak as compared to that shown in FIG. 1 enables a reduction in the area of separation between active regions of an MOS circuit.

Thus, an oxidation process has been described which provides field oxide regions with small bird's beak profiles. By providing a thermally grown nitride layer and an initial dry oxidation step, lateral oxidation along the nitride silicon interface is reduced.

I claim:

1. A process for the isolation of semiconductor elements on a silicon substrate comprising the steps of:
   thermally growing a first silicon nitride layer of a first thickness on the surface of said substrate;
   depositing a second layer of silicon nitride of a second thickness on said first layer;
   exposing predetermined regions of said substrate by removing portion of said first and second layers;
   forming an oxide on said exposed regions by subjecting said substrate to an atmosphere of chlorine ambient at a temperature above that of the flow point of silicon dioxide;
   further oxidizing said exposed regions in a pressurized atmosphere in the presence of oxygen;
   whereby the formation of oxide at the nitride-substrate interface is reduced, and electrical isolation of semiconductor elements is achieved in a reduced area.

2. The process as described in claim 1 wherein said first layer of silicon nitride is approximately 25-30A thick.

3. The process as described in claim 1 wherein said second layer of silicon nitride is approximately 250A thick.

4. The process as described in claim 1 wherein said second layer is formed by low pressure chemical vapor deposition.

5. The process as described in claim 1 wherein said substrate is exposed to a chlorine atmosphere at 1000 degrees C.

6. The process as described in claim 1 wherein said layer grown in a chlorine ambient is approximately 500A thick.

7. The process as described in claim 1 wherein said layer grown in the presence of oxygen is approximately 6000A thick.

8. The process as described in claim 1 wherein said further oxidation is accomplished in a wet atmosphere.

9. The process as defined by claim 1 wherein said further oxidation takes place at approximately 920° C.

* * * * *